United States Patent
Hetzler

(10) Patent No.: US 10,884,861 B2
(45) Date of Patent: Jan. 5, 2021

(54) WRITE-BALANCED PARITY ASSIGNMENT WITHIN A CLUSTER

(71) Applicant: International Business Machines Corporation, Armonk, NY (US)

(72) Inventor: Steven R. Hetzler, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 16/205,069

(22) Filed: Nov. 29, 2018

(65) Prior Publication Data

US 2020/0174885 A1 Jun. 4, 2020

(51) Int. Cl.
| G06F 11/00 | (2006.01) |
| G06F 11/10 | (2006.01) |
| G06F 3/06 | (2006.01) |
| H03M 13/05 | (2006.01) |

(52) U.S. Cl.
CPC .......... *G06F 11/1096* (2013.01); *G06F 3/061* (2013.01); *G06F 3/0653* (2013.01); *G06F 3/0665* (2013.01); *G06F 3/0683* (2013.01); *G06F 11/1044* (2013.01); *H03M 13/05* (2013.01)

(58) Field of Classification Search
CPC .. G06F 11/1096; G06F 11/1044; G06F 3/061; G06F 3/0653; G06F 3/0665; G06F 3/0683; G06F 3/0688; G06F 3/0689; G06F 2211/1011; G06F 2211/1023; G06F 2211/1026; G06F 2211/1028; G06F 2211/1095; G06F 2212/403; H03M 13/05; H03M 1/0687
See application file for complete search history.

(56) References Cited

U.S. PATENT DOCUMENTS

| 5,278,838 | A | 1/1994 | Ng et al. | |
| 5,682,273 | A | 10/1997 | Hetzler | |
| 5,889,795 | A * | 3/1999 | Niijima | G06F 11/1076 365/200 |
| 6,807,642 | B2 | 10/2004 | Yamamoto et al. | |
| 7,346,831 | B1 * | 3/2008 | Corbett | G06F 11/1076 714/5.11 |
| 10,146,652 | B2 | 12/2018 | Hetzler | |
| 2006/0101319 | A1 | 5/2006 | Park et al. | |
| 2015/0363111 | A1 * | 12/2015 | Markhovsky | G06F 3/0685 711/102 |
| 2017/0147265 | A1 * | 5/2017 | Kingdon | G06F 11/108 |
| 2017/0235631 | A1 | 8/2017 | Hetzler | |
| 2018/0024877 | A1 | 1/2018 | Gold et al. | |

(Continued)

OTHER PUBLICATIONS

Anonymous, "NIST Cloud Computing Program," NIST, Information Technology Laboratory, Nov. 13, 2013, pp. 1-2, retrieved from www.nist.gov/itl/cloud/.

(Continued)

*Primary Examiner* — Anthony J Amoroso
(74) *Attorney, Agent, or Firm* — Zilka-Kotab, P.C.

(57) ABSTRACT

According to one embodiment, a computer-implemented method includes determining a write speed for each of a plurality of systems in a cluster, determining a ratio of the write speeds for each of the plurality of systems in the cluster, and updating parity assignments to each of the plurality of systems in the cluster, based on the ratio of the write speeds.

20 Claims, 12 Drawing Sheets

(56) References Cited

U.S. PATENT DOCUMENTS

2020/0026601 A1* 1/2020 Ricker .................... G06F 3/065

OTHER PUBLICATIONS

Mell et al., "The NIST Definition of Cloud Computing," Version 15, Dec. 7, 2009, pp. 1-2.
Mell et al., "The NIST Definition of Cloud Computing," Recommendations of the National Institute of Standards and Technology, NIST Special Publication 800-145, Sep. 2011, pp. 1-7.
Hetzler, S., U.S. Appl. No. 15/041,999, filed Feb. 11, 2016.

* cited by examiner

Write Sequence (1200)

| Time | Sys0 | Sys1 | Sys2 |
|---|---|---|---|
| T0 | A0 | B0 | C0 |
| T1 | A1 |  | C1 |
| T2 | A2 |  | C2 |
| T3 |  | B1 |  |
| T4 |  | B2 |  |
| T5 | A3 | B3 |  |
| T6 |  |  |  |
| T7 |  |  |  |
| T8 |  |  | C3 |
| T9 | A4 |  |  |

Parity Layout (1210)

| Stripe | Sys0 | Sys1 | Sys2 |
|---|---|---|---|
| 0 | A0 | P0 | C0 |
| 1 | A1 | B0 | P1 |
| 2 | A2 | P2 | C1 |
| 3 | P3 | B1 | C2 |
| 4 | A3 | B2 | P4 |
| 5 | P5 | B3 | C3 |
| 6 | A4 |  |  |

FIG. 12

US 10,884,861 B2

WRITE-BALANCED PARITY ASSIGNMENT WITHIN A CLUSTER

BACKGROUND

The present invention relates to clustered storage systems, and more specifically, this invention relates to implementing fault tolerance within clustered storage systems.

Data storage clusters are commonly used to store data for a variety of applications, systems, etc. However, current fault tolerance implementations within these data storage clusters do not consider various characteristics of systems in the data storage cluster, which may negatively impact a write performance and storage space utilization of the systems in the data storage cluster.

SUMMARY

According to one embodiment, a computer-implemented method includes determining a write speed for each of a plurality of systems in a cluster, determining a ratio of the write speeds for each of the plurality of systems in the cluster, and updating parity assignments to each of the plurality of systems in the cluster, based on the ratio of the write speeds.

According to another embodiment, a computer program product for implementing a write-balanced parity assignment within a cluster includes a computer readable storage medium that has program instructions embodied therewith, where the computer readable storage medium is not a transitory signal per se, and where the program instructions are executable by a processor to cause the processor to perform a method including determining, by the processor, a write speed for each of a plurality of systems in the cluster, determining, by the processor, a ratio of the write speeds for each of the plurality of systems in the cluster, and updating, by the processor, parity assignments to each of the plurality of systems in the cluster, based on the ratio of the write speeds.

According to another embodiment, a system includes a processor, and logic integrated with the processor, executable by the processor, or integrated with and executable by the processor, where the logic is configured to determine a write speed for each of a plurality of systems in a cluster, determine a ratio of the write speeds for each of the plurality of systems in the cluster, and update parity assignments to each of the plurality of systems in the cluster, based on the ratio of the write speeds.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 12 illustrates an example of an on-demand parity assignment implementation, in accordance with one embodiment.

DETAILED DESCRIPTION

Figure 1:
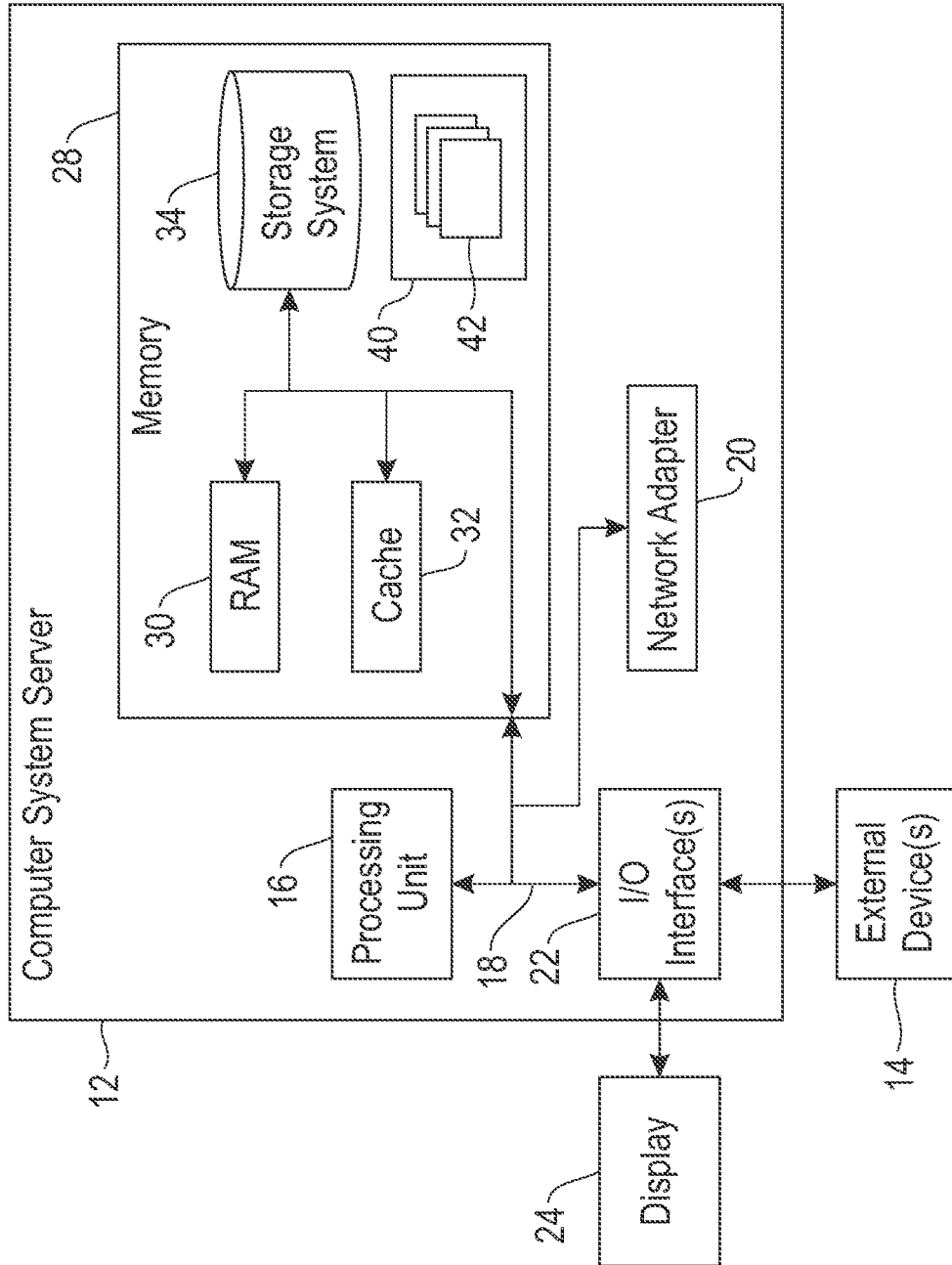
FIG. 1 depicts a cloud computing node according to an embodiment of the present invention.

The following description discloses several preferred embodiments of systems, methods and computer program products for implementing a write-balanced parity assignment within a cluster. Various embodiments provide a method for adjusting a parity data ratio for systems in a cluster, based on a write speed ratio for the systems in the cluster.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for implementing a write-balanced parity assignment within a cluster.

In one general embodiment, a computer-implemented method includes determining a write speed for each of a plurality of systems in a cluster, determining a ratio of the write speeds for each of the plurality of systems in the cluster, and updating parity assignments to each of the plurality of systems in the cluster, based on the ratio of the write speeds.

In another general embodiment, a computer program product for implementing a write-balanced parity assignment within a cluster includes a computer readable storage medium that has program instructions embodied therewith, where the computer readable storage medium is not a transitory signal per se, and where the program instructions are executable by a processor to cause the processor to perform a method including determining, by the processor, a write speed for each of a plurality of systems in the cluster, determining, by the processor, a ratio of the write speeds for each of the plurality of systems in the cluster, and updating, by the processor, parity assignments to each of the plurality of systems in the cluster, based on the ratio of the write speeds.

In another general embodiment, a system includes a processor, and logic integrated with the processor, executable by the processor, or integrated with and executable by the processor, where the logic is configured to determine a write speed for each of a plurality of systems in a cluster, determine a ratio of the write speeds for each of the plurality of systems in the cluster, and update parity assignments to each of the plurality of systems in the cluster, based on the ratio of the write speeds.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
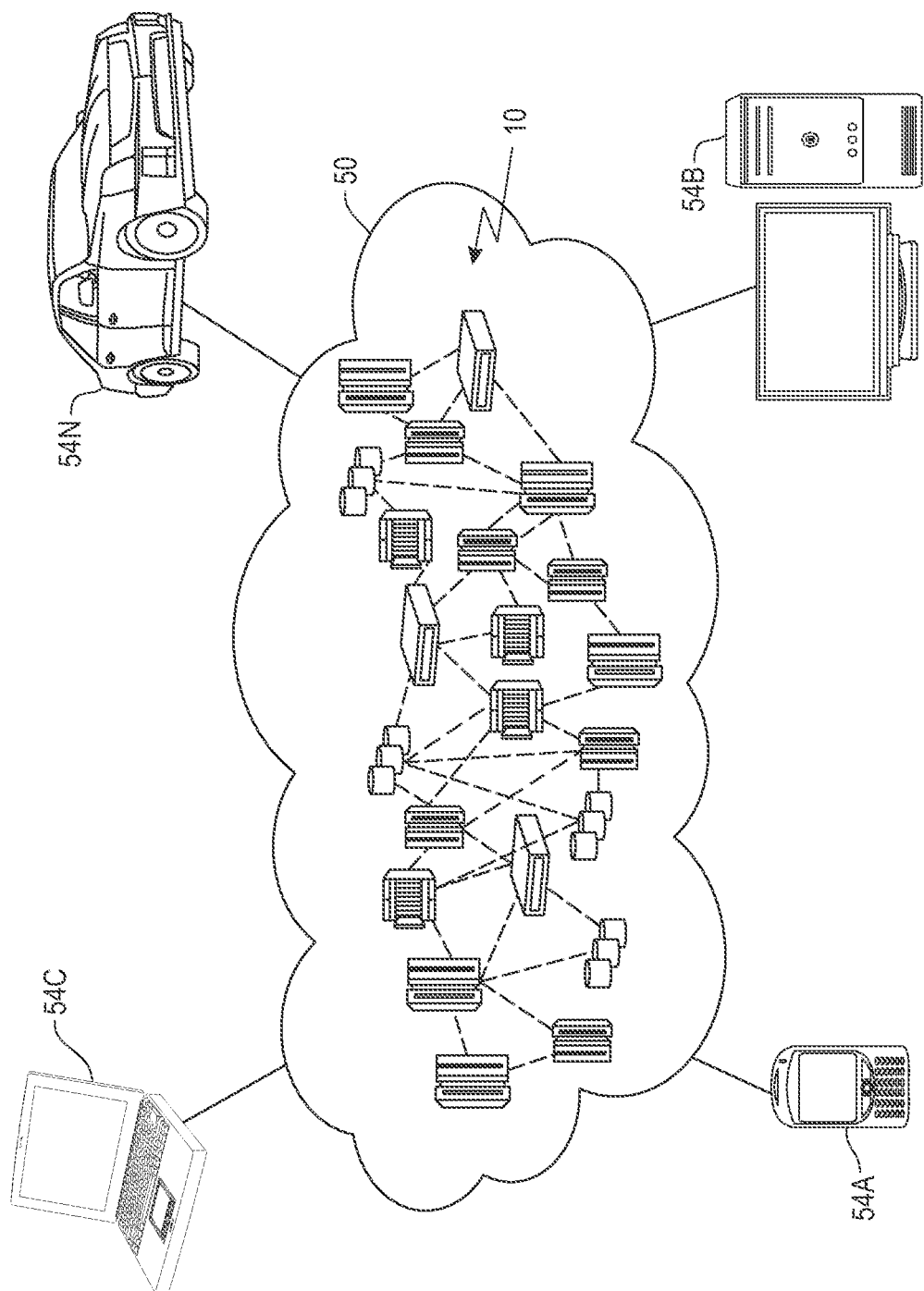
FIG. 2 depicts a cloud computing environment according to an embodiment of the present invention.

Referring now to FIG. 2, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
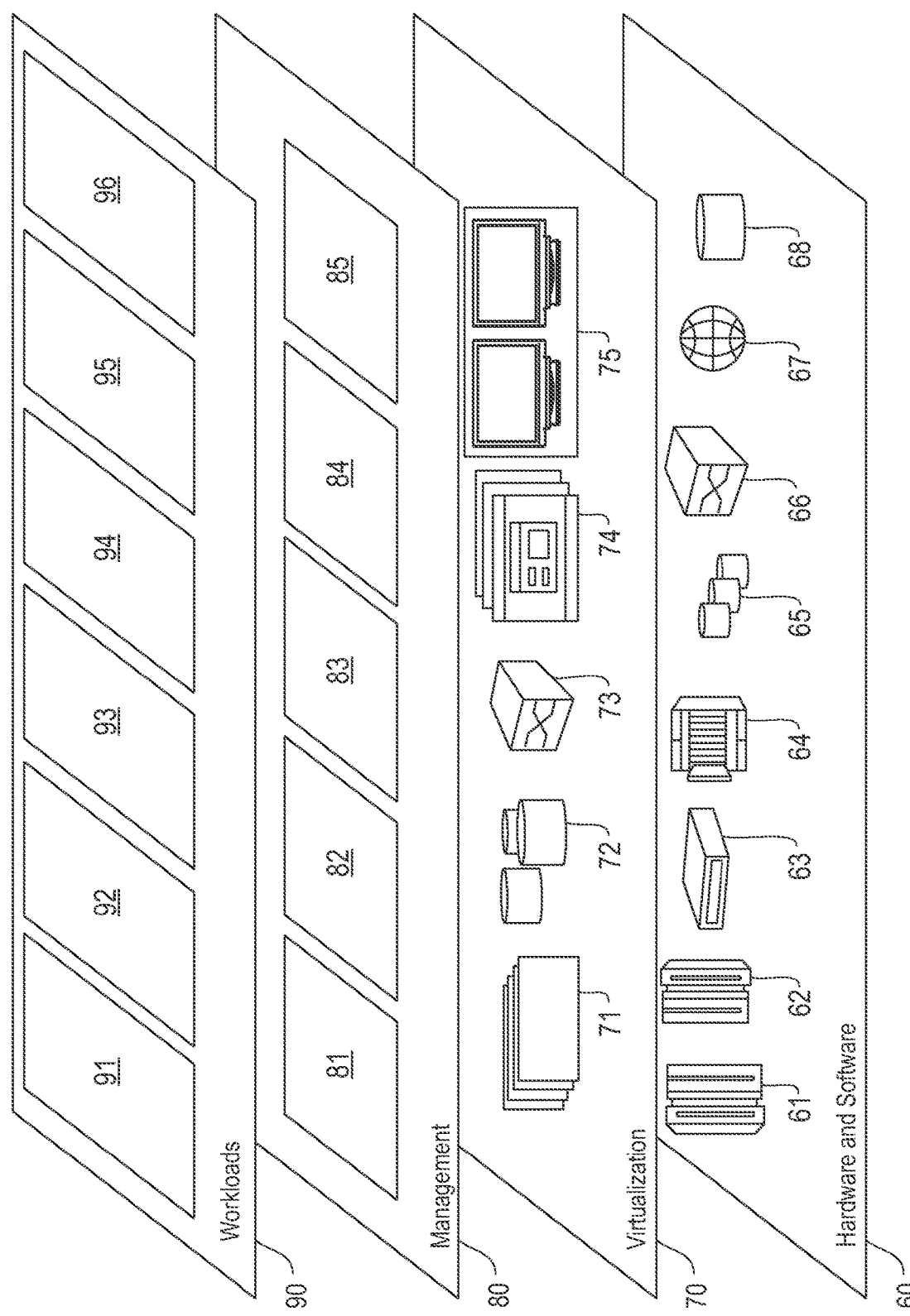
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and data storage 96.

Figure 4:
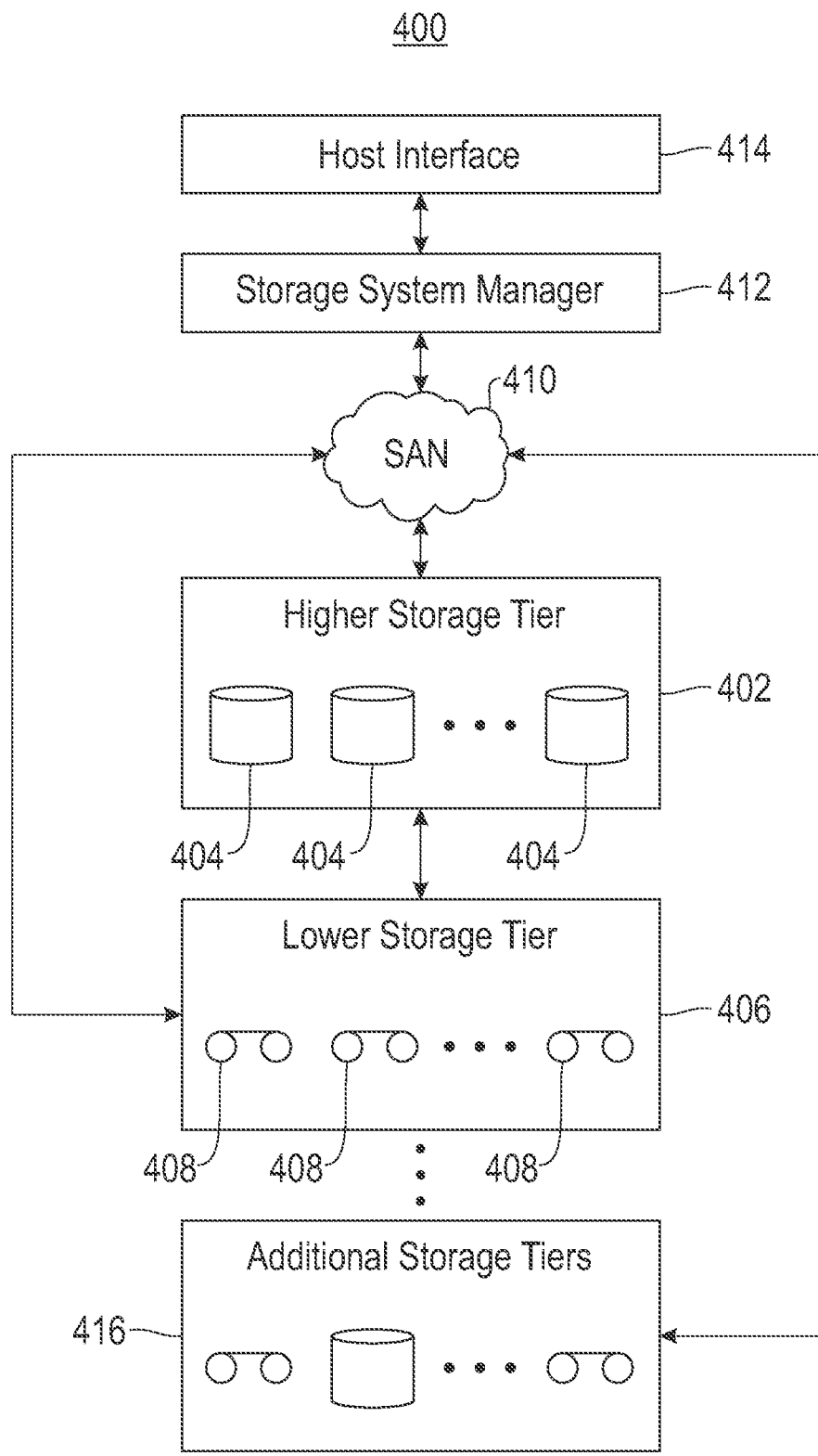
FIG. 4 illustrates a tiered data storage system in accordance with one embodiment.

Now referring to FIG. 4, a storage system 400 is shown according to one embodiment. Note that some of the elements shown in FIG. 4 may be implemented as hardware and/or software, according to various embodiments. The storage system 400 may include a storage system manager 412 for communicating with a plurality of media on at least one higher storage tier 402 and at least one lower storage tier 406. The higher storage tier(s) 402 preferably may include one or more random access and/or direct access media 404, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 406 may preferably include one or more lower performing storage media 408, including sequential access media such as magnetic tape in tape drives and/or optical media, slower accessing HDDs, slower accessing SSDs, etc., and/or others noted herein or known in the art. One or more additional storage tiers 416 may include any combination of storage memory media as desired by a designer of the system 400. Also, any of the higher storage tiers 402 and/or the lower storage tiers 406 may include some combination of storage devices and/or storage media.

The storage system manager 412 may communicate with the storage media 404, 408 on the higher storage tier(s) 402 and lower storage tier(s) 406 through a network 410, such as a storage area network (SAN), as shown in FIG. 4, or some other suitable network type. The storage system manager 412 may also communicate with one or more host systems (not shown) through a host interface 414, which may or may not be a part of the storage system manager 412. The storage system manager 412 and/or any other component of the storage system 400 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 400 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 402, may include a majority of SSD storage media for storing data in a higher performing storage environment, and remaining storage tiers, including lower storage tier 406 and additional storage tiers 416 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 402, while data not having one of these attributes may be stored to the additional storage tiers 416, including lower storage tier 406. Of course, one of skill in the art, upon reading the present descriptions, may devise many other combinations of storage media types to implement into different storage schemes, according to the embodiments presented herein.

According to some embodiments, the storage system (such as 400) may include logic configured to receive a request to open a data set, logic configured to determine if the requested data set is stored to a lower storage tier 406 of a tiered data storage system 400 in multiple associated portions, logic configured to move each associated portion of the requested data set to a higher storage tier 402 of the tiered data storage system 400, and logic configured to assemble the requested data set on the higher storage tier 402 of the tiered data storage system 400 from the associated portions.

Of course, this logic may be implemented as a method on any device and/or system or as a computer program product, according to various embodiments.

Overview

In a clustered storage system, write data rates of individual systems may vary, leading to an imbalance on the parity system(s). The prior manner of handling this was to perform partial parity writes to the parity systems. This invention discloses the method of selecting the cluster parity system assignments based on the system write data rates. Systems with the slowest write data rates are assigned proportionally larger fractions of the cluster parity. This will improve the write balance and reduce the need for partial parity writes. Note that this solution also applies where the expected capacity utilization in systems varies, whereby systems with lower local utilization are assigned more cluster parity. Costs are reduced by this scheme, as the space allocated for parity in a cluster may be more efficiently distributed.

Figure 5:
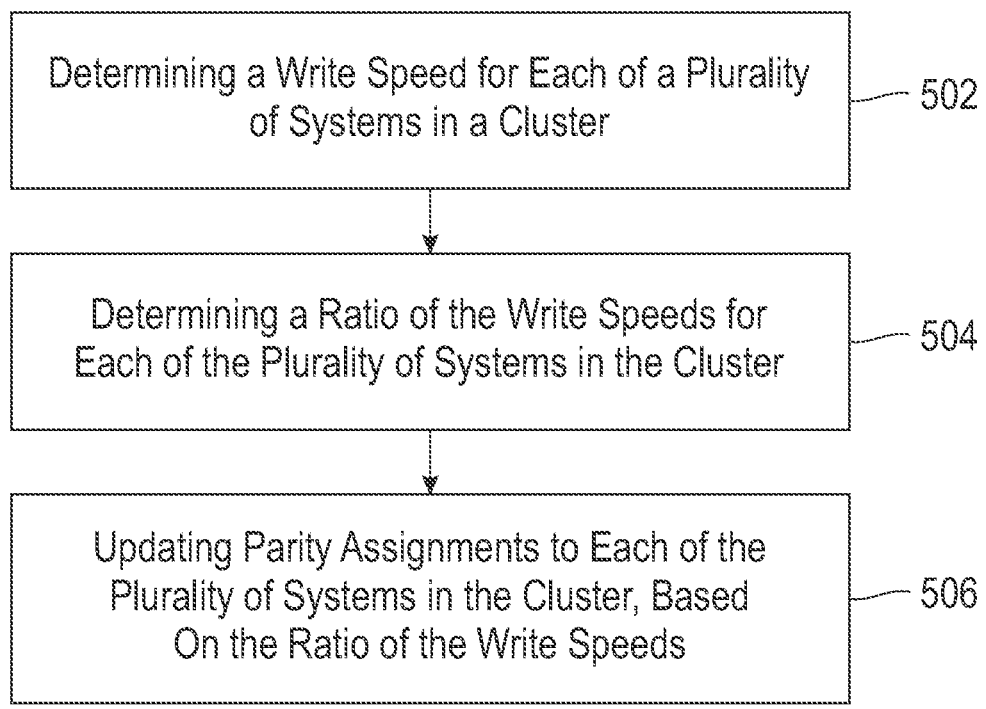
FIG. 5 illustrates a flowchart of a method for implementing a write-balanced parity assignment within a cluster, in accordance with one embodiment.

Now referring to FIG. 5, a flowchart of a method 500 is shown according to one embodiment. The method 500 may be performed in accordance with the present invention in any of the environments depicted in FIGS. 1-4 and 6, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 5, method 500 may initiate with operation 502, where a write speed is determined for each of a plurality of systems in a cluster. In one embodiment, each of the plurality of systems may include a data storage system. For example, each system may include one or more storage drives (e.g., hard disk drives, storage drives, tape drives, etc.) for storing data. In another embodiment, each of the plurality of systems may include a storage server, a database, etc. In yet another embodiment, the cluster may include a clustered storage environment. For example, data from one or more computing devices may be sent to the cluster for storage and/or retrieval.

Additionally, in one embodiment, the cluster may include all or a portion of a data center. In another embodiment, the cluster may be cloud-based. For example, the cluster may include a cloud-based storage environment. In yet another embodiment, data may be written to the plurality of systems asynchronously. In still another embodiment, an erasure code for the cluster may be log based or block based.

Further, in one embodiment, the write speed for a system may equate to an amount of data received by and written to the system over a predetermined period of time. In another embodiment, each system may include a plurality of storage portions of one or more storage drives within the system. For example, each of the storage portions may include a portion of one or more storage drives within the system. In another example, each portion may constitute a stripe, or storage location.

Further still, in one embodiment, each system may include a first volume for storing received data, and a second volume for storing cluster parity data. In another embodiment, at least one of the volumes of each system may be thin provisioned. In yet another embodiment, a parity of the cluster may be thin provisioned.

Also, in one embodiment, the write speed for a system may indicate a number of storage portions of the system to which data is written within a predetermined time period. In another embodiment, the write speed for each of the plurality of systems in the cluster may be determined by monitoring the plurality of systems. In yet another embodiment, the monitoring may be performed by the plurality of systems themselves.

In addition, in one embodiment, the monitoring may be performed by a monitoring system separate from the plurality of systems in the cluster. In another embodiment, the monitoring may be performed during a calculation of parity data. For example, a subset of systems within the cluster may receive from first system within the cluster data written to storage portions of the first system, in order to create parity data that is written to storage portions of the subset of systems to prevent a loss of the data written to the storage portions of the first system. In another example, the subset of systems may communicate with each other (e.g., by sharing information regarding an amount of the data written to the storage portions of the first system as well as time information indicating a time when the data was received) in order to determine a write speed for the first system.

Furthermore, in one embodiment, each of the plurality of systems may determine their own write speed and report it to one or more systems in the cluster. In another embodiment, the monitoring may be performed according to a schedule. For example, the monitoring may be performed at a predetermined time interval. In yet another embodiment, the monitoring may be performed in response to identifying that a predetermined amount of data has been transferred to the cluster for storage.

Further still, in one embodiment, the monitoring may be performed in response to identifying that a predetermined number of partial parity data computations have been performed by the plurality of systems in the cluster. For example, a first system within the cluster may receive, from two or more systems within the cluster, data written to storage portions of the two or more systems, in order to create parity data that is written to a storage portion of the first system to prevent a loss of the data written to the storage portions of the two or more systems. In another example, when at least one of the two or more systems does not send data to the first system within a predetermined amount of time, the first system may compute partial parity data using only a portion of the data necessary to create the parity data. In yet another example, each time this occurs, a counter may be incremented, and the monitoring may be performed when the counter exceeds a predetermined threshold.

Also, in one embodiment, a write speed may be predicted for one or more of the plurality of systems in the cluster. For example, each of the plurality of systems in the cluster may be associated with a number of virtual machines assigned to a client. In another example, a write speed for each of the plurality of systems in the cluster may be predicted, based on the number of purchased virtual machines associated with the system.

Additionally, method 500 may proceed with operation 504, where a ratio of the write speeds for each of the plurality of systems in the cluster is determined. In one embodiment, determining the ratio of the write speeds for each of the plurality of systems may include identifying the write speed for each of the plurality of systems for a predetermined period of time, and determining a ratio of the write speeds for the predetermined period of time. For example, if a first system has a write speed of ten written stripes for the predetermined time period, a second system has a write speed of eight written stripes for the predetermined time period, and a third system has a write speed of six written stripes for the predetermined time period, the ratio of write speeds for the first, second, and third systems may have a value of 10:8:6, which reduces to 5:4:3.

Further, method 500 may proceed with operation 506, where parity assignments to each of the plurality of systems in the cluster are updated, based on the ratio of the write speeds. In one embodiment, the parity assignments to each of the plurality of systems in the cluster may be based on a ratio of parity data to be written to each of the plurality of systems that is determined based on the ratio of the write speeds. In another embodiment, the ratio of parity data to be written to each of the plurality of systems may include a ratio of parity data to be calculated by each of the plurality of systems and written to storage portions of the systems. For example, a ratio of parity data to be written for first, second, and third systems having a value of 1:1:1 means that each of the first, second, and third systems are responsible for calculating and/or storing an equal amount of parity stripes during a predetermined time period. In another embodiment, a ratio of parity data to be written for first, second, and third systems having a value of 1:2:3 means that for every parity stripe calculated and stored by the first system during a predetermined time period, two parity stripes are calculated and stored by the second system during that predetermined time period, and three parity stripes are calculated and stored by the second system during that predetermined time period.

Further still, in one embodiment, parity assignments for each of the plurality of systems in the cluster may be updated, based on the ratio of parity data to be written to each of the plurality of systems in the cluster. For example, the parity assignments may indicate when each of the plurality of systems in the cluster are to perform parity calculation and storage operations. In another example, these parity assignments may be updated to correspond with the ratio of parity data to be written to each of the plurality of systems in the cluster. In yet another example, the updated parity assignments may be distributed to each of the plurality of systems in the cluster for implementation.

In this way, parity calculation and storage operations may be dynamically readjusted amongst each of the plurality of the systems in the cluster, based on dynamically updated write speeds for each of the plurality of systems in the cluster. When a first system in the cluster receives less data to be written to the system, and therefore experiences a decreased write speed, when compared to the other systems in the cluster for a predetermined time period, the first system may receive a greater number of parity assignments, and may therefore be instructed to perform an increased amount of parity calculation and storage operations. This may improve a performance of all systems in the cluster by reducing a waiting time for parity calculations by the plurality of systems and more evenly balancing an amount of data stored by each of the plurality of systems.

Figure 6:
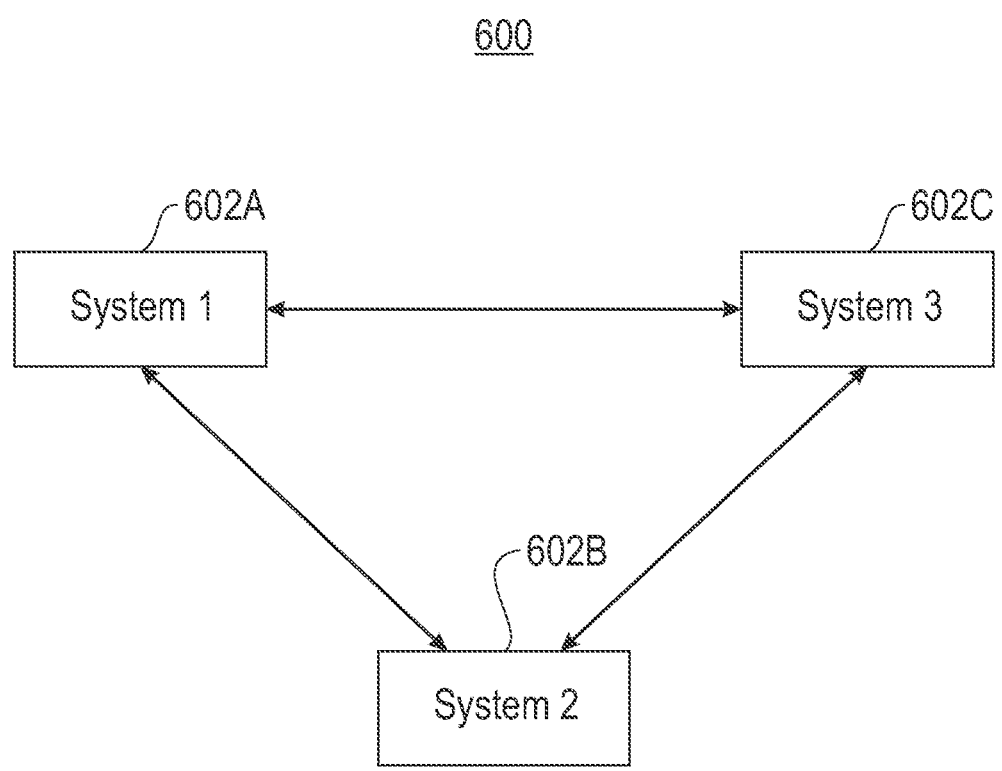
FIG. 6 illustrates an exemplary storage cluster, in accordance with one embodiment.

FIG. 6 illustrates an exemplary storage cluster 600, according to one embodiment. In one embodiment, a plurality of systems 602A-C within the storage cluster 600 may receive and store data from one or more external systems. For example, each of the plurality of systems 602A-C may receive data to be written (e.g., via one or more file systems, one or more object interfaces, one or more direct access operations, etc.), and may write the data to one or more storage portions of the system.

In another example, the exemplary storage cluster 600 may include a clustered storage environment. In another embodiment, each of the plurality of systems 602A-C may be located at the same physical location, or one or more of the plurality of systems 602A-C may be located at a physical location different from the physical location of the other plurality of systems 602A-C. For example, a first system 602A may be physically located in New York, a second system 602B may be physically located in Chicago, and a third system 602C may be located in Los Angeles.

Additionally, it should be noted that although three systems 602A-C are shown, the exemplary storage cluster 600 may include a greater number of systems, where each system is in communication with all other systems.

Further, in one embodiment, each of the plurality of systems 602A-C may provide parity operations for the other plurality of systems 602A-C. For example, the first system 602A may provide parity operations for the second system 602B and the third system 602C, the second system 602B may provide parity operations for the first system 602A and the third system 602C, and the third system 602C may provide parity operations for the second system 602B and the first system 602A.

In another example, each of the plurality of systems 602A-C may provide parity operations according to parity assignments made to the plurality of systems 602A-C. For example, a parity assignment made to the first system 602A may indicate that the first system 602A is to perform a parity operation for a predetermined storage portion of the plurality of systems 602A-C. If the predetermined storage portion is an Nth storage drive stripe within each of the plurality of systems 602A-C, the first system 602A may receive data written by the second system 602B to the Nth storage drive stripe within the second system 602B, as well as data written by the third system 602C to the Nth storage drive stripe within the third system 602C.

The first system 602A may then compute parity data based on the received data, and may store the parity data to the Nth storage drive stripe within the first system 602A. This parity data may be used to recover the data written by the second system 602B to the Nth storage drive stripe within the second system 602B, or data written by the third system 602C to the Nth storage drive stripe within the third system 602C, in case of error, failure, etc. In one embodiment, data received from external systems may be stored in a first drive of each of the systems 602A-C, and parity data may be stored in a second drive of each of the systems 602A-C that is separate from the first drive.

Further still, in one embodiment, upon an initialization of the plurality of systems 602A-C within the storage cluster 600, an initial parity data ratio may be used to create initial parity assignments that are assigned to the plurality of systems 602A-C. For example, the initial parity data ratio may include a default parity data ratio of 1:1:1, such that each of the plurality of systems 602A-C are responsible for calculating and storing an equal amount of parity stripes during a predetermined time period. In another embodiment, the initial parity data ratio may be calculated based on environmental data associated with the plurality of systems 602A-C (e.g., a number of virtual machines assigned to each of the plurality of systems 602A-C, a historical usage of systems at various physical locations, etc.).

Also, in one embodiment, data storage operations may be performed, utilizing the initial parity assignments. In another embodiment, a write speed of each of the plurality of systems 602A-C may be determined. For example, the write speed of each of the plurality of systems 602A-C may be determined according to a predetermined time schedule, in response to a predetermined amount of data being received and stored by the storage cluster 600, etc. In another example, the write speed of each of the plurality of systems 602A-C may be determined in response to identifying that a predetermined number of partial parity data computations have been performed by the plurality of systems 602A-C during a predetermined time period.

In addition, in one embodiment, the write speed of each of the plurality of systems 602A-C may be determined by the plurality of systems 602A-C themselves. For example, the first system 602A may monitor an amount of data received from the second system 602B and the third system 602C while calculating parity data for such data. This monitored data may be shared with the other systems 602B and 602C, so that each of the plurality of systems 602A-C is aware of the write speed of all of the plurality of systems 602A-C. In another embodiment, each of the plurality of systems 602A-C may monitor and report their own write speeds.

Furthermore, in one embodiment, upon receiving the write speed for each of the plurality of systems 602A-C, the first system 602A may determine a ratio of the write speeds, and may calculate an updated parity data ratio, based on the ratio of the write speeds. The first system 602A may then determine updated parity assignments based on the updated parity data ratio, and may distribute the updated parity assignments to the second system 602B and the third system 602C. Each of the plurality of systems 602A-C may then implement the updated parity assignments. In another embodiment, each of the plurality of systems 602A-C may need to approve the updated parity assignments before they are implemented.

Further still, in one embodiment, data storage operations may be performed, utilizing the updated parity assignments. The updated parity assignments may be further amended in the future using an additional updated parity data ratio calculated using additional updated write speeds for each of the plurality of systems 602A-C.

In this way, parity assignments made to each of the plurality of systems 602A-C within the storage cluster 600 may be dynamically adjusted in response to changing write speeds of each of the plurality of systems 602A-C over time. By more evenly distributing parity assignments based on write speed, wait times for performing parity operations may be reduced, and the calculation and storage of partial parity data may be reduced as well, thereby improving the performance of each of the plurality of systems 602A-C. This may improve both a write performance and a storage space utilization of each of the plurality of systems 602A-C.

Write Balanced Parity Assignment in a Cluster

Description

In a clustered storage system, the cluster erasure code may be asynchronous. Further, unlike striped cluster codes, each system in the cluster may be independent, and thus have an independent write data rate. In one embodiment, this may be handled by performing partial parity writes. The current invention addresses independent write rates by assigning cluster parity locations in a manner inversely related to the write data rate. In this way, slow writing systems will have a higher proportion of storage allocated to cluster parity, and a lower proportion allocated to local data storage. In general, a certain amount of capacity will be reserved for cluster data, relative to the proportion of parity units in the cluster erasure code. In certain environments, such as a cloud computing environment, capacity may be added to each system over time, providing ongoing opportunities to reassign cluster parity storage. This invention works with both block and log-based mapping schemes. The descriptions below will refer to using log-based mapping scheme for simplicity.

Figure 7:
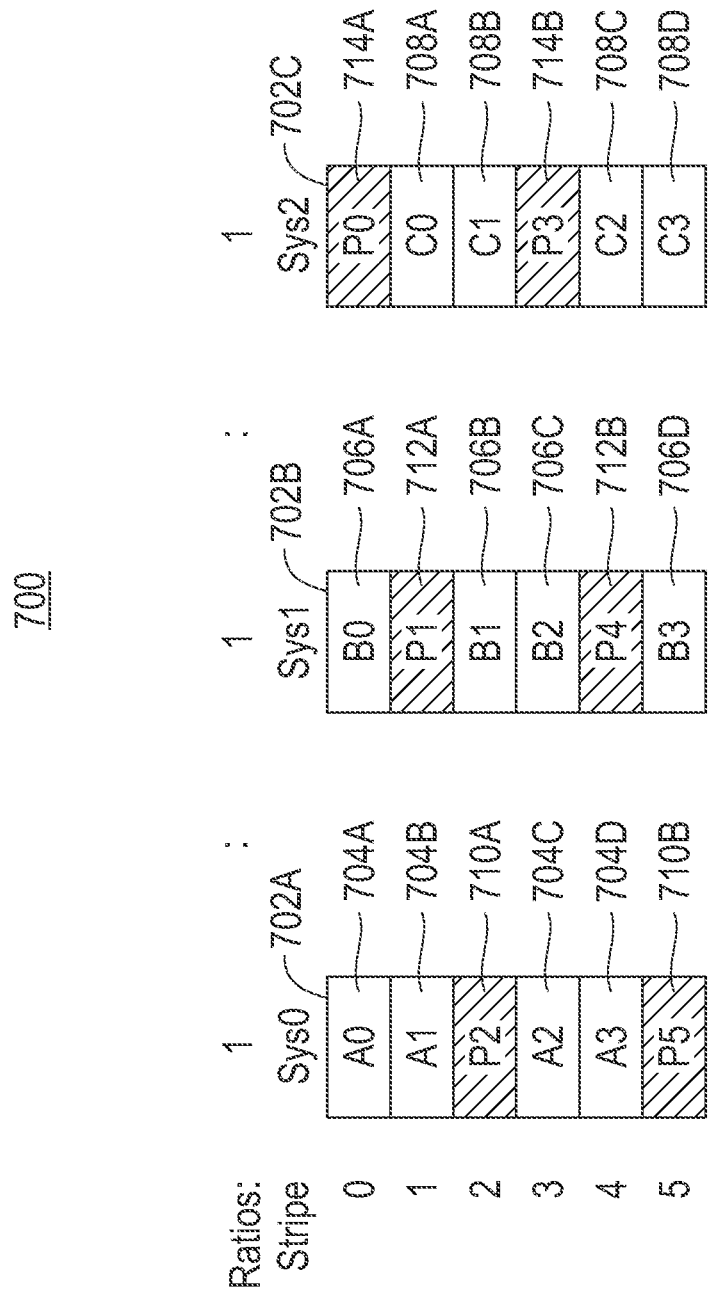
FIG. 7 illustrates an example of a portion of a three-system cluster with a 2+P cluster code, in accordance with one embodiment.

FIG. 7 shows an example 700 of a portion of a three-system cluster, with a 2+P cluster code. The local erasure code (if any) is not shown here. Parity is rotated evenly between the three systems. Shown for each system 702A-C are four local information stripes 704A-D, 706A-D, and 708A-D (which can hold local data or local parity), and two cluster parity stripes 710A-B, 712A-B, and 714A-B. The term stripe here refers to portion of the storage, and the locations of the stripes shown are logical. If the local information stripe portion of a system (including any local parity) is assigned as a first volume, and the cluster parity portion as a second volume, then the nominal capacities of the portions here would be local volume sizes of four stripes, and cluster parity volume sizes of two stripes for each system. When all the systems have similar write ratios (1:1:1) and similar occupancy ratios, then the above arrangement is suitable.

However, the systems in the cluster may all be independent; therefore, the write ratios and occupancies are not expected to be 1:1:1 in general. In the case of unequal write rates, equal parity assignments can be sub-optimal, impacting cluster capacity and performance.

Figure 8:
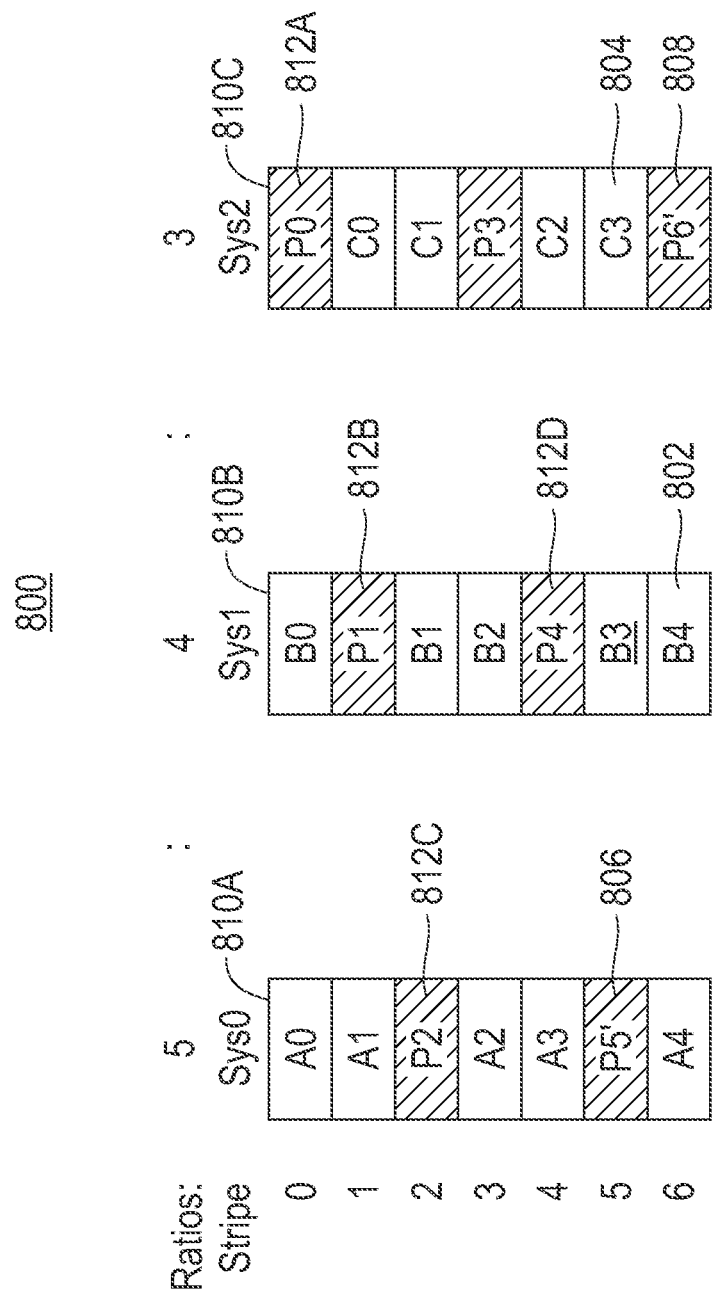
FIG. 8 illustrates an exemplary three cluster system with a write ratio of 5:4:3, in accordance with one embodiment.

FIG. 8 shows an exemplary three cluster system 800 with a write ratio of 5:4:3. Some stripes 802 and 804 have not been written within the system. Partial parity stripes 806 and 808 are labeled with a prime mark ('). As shown, the write ratios are 5:4:3 in a given time interval, and the parity assignments are equal. In this interval, Sys0 810A has written A0-A4, Sys1 810B has written B0-B3, and Sys2 810C has written C0-C2 (data not yet written is shown in gray). This results in cluster parity stripes P0-P4 812A-D being complete. However, P5 806 and P6 808 are not complete (indicated by the prime mark). In each case, only some of the data has been received, thus these are subject to partial parity writes. This means that either the parity stripes will need to be updated later or garbage collected later. These will impact the performance. Note further that if the write ratio is persistent long term, then capacity is impacted as well. What is needed is a method to handle unequal write rates without the performance and capacity impacts.

If a system in the cluster has a lower write rate than the other systems in the cluster, assigning it a greater portion of the cluster parity will improve both the capacity and the cluster performance. It has both idle capacity and write bandwidth, relative to the other systems. In this invention, we assign the cluster parity in an unequal manner to mitigate the unequal write rates.

Figure 9:
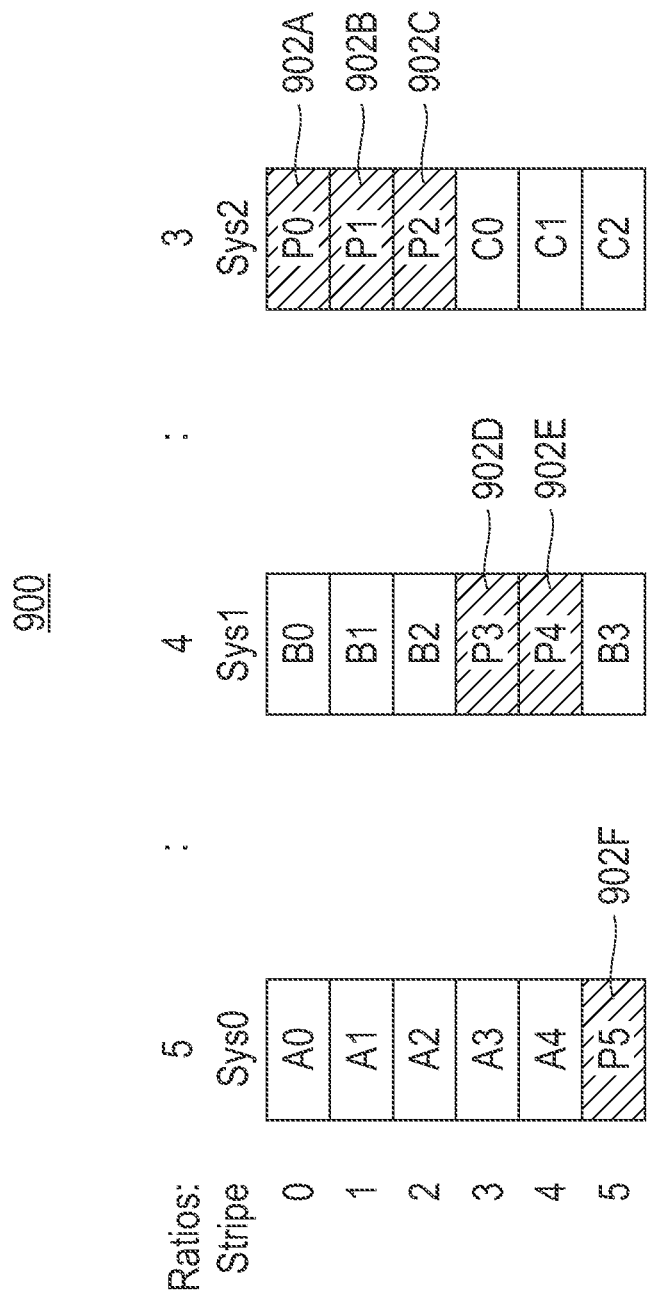
FIG. 9 illustrates an example of a 5:4:3 unequal write ratio of FIG. 8, but with unequal cluster parity assignments, in accordance with one embodiment.

FIG. 9 shows an example of a 5:4:3 unequal write ratio of FIG. 8, but with unequal cluster parity assignments. Note that all parity stripes 902A-F are fully written after the given time interval. Thus, the data fits in six parity stripes, instead of seven parity stripes in FIG. 8). Thus, all systems have written six stripes worth of information, equalizing the effective write rates. So, for a write ratio of 5:4:3, a parity ratio of 1:2:3 gives a fully balanced solution.

The parity ratios can be determined for write ratios in many cases. In situations where an exact solution isn't possible, use of approximate solutions in combination with partial parity writes can accommodate the write rates while reducing the need for partial parity writes over equal cluster parity assignments.

Let Dk be the number of local stripes written to system k in a given time interval, and Pk be the number of cluster parity stripes written to system k in the same time interval. For a perfect solution, each column must have the same total of local and cluster parity stripes, and this sum must be the total number of cluster parity stripes since every row has a cluster parity. So we have:

$$\Sigma_k P_k = P_j + D_j$$

This gives the set of equations for 3 systems:

$$P0+P1=D2,$$

$$P0+P2=D1,$$

$$P1+P2=D0.$$

These can be solved for the individual parities. Assume that we have sorted the Dk values such that D0 is the maximum:

$$P0=2(D2+D1-D0)$$

$$P1=D2-P0$$

$$P2=D0-P1$$

Of course, the Pk need to be positive integers. If (D2+D1−D0) is odd, then we multiply the Dk and Pk values by 2 to obtain integers (this doesn't change the write ratios). If (D2+D1−D0)<0, then there is no exact solution. For convenience we can define:

$$f = \begin{cases} 0 & \text{if } (D2 + D1 - D0) < 0 \\ 1 & \text{if } (D2 + D1 - D0) \text{ even}, \\ 2 & \text{if } (D2 + D1 - D0) \text{ odd} \end{cases}$$

and use it as a prefactor on Pn and the effective Dn results.

The solution for 1:1:1 gives f=2, so D0=D1=D3=2, and P0=P1=P2=1, and is shown in FIG. 7. The f=2 term shows 2 local and 1 cluster parity for each system (2 such sets are shown).

Table 1 shows results for some different write ratios, according to one exemplary embodiment.

TABLE 1

| Sys0 | Sys1 | Sys2 | f | Data0 | Data1 | Data2 | Parity0 | Parity1 | Parity2 |
|---|---|---|---|---|---|---|---|---|---|
| 1 | 1 | 1 | 2 | 2 | 2 | 2 | 1 | 1 | 1 |
| 2 | 1 | 1 | 1 | 2 | 1 | 1 | 0 | 1 | 1 |
| 2 | 2 | 1 | 2 | 4 | 4 | 2 | 1 | 1 | 3 |
| 3 | 2 | 1 | 1 | 3 | 2 | 1 | 0 | 1 | 2 |
| 3 | 3 | 1 | 2 | 6 | 6 | 2 | 1 | 1 | 5 |
| 4 | 3 | 1 | 1 | 4 | 3 | 1 | 0 | 1 | 3 |
| 5 | 4 | 3 | 1 | 5 | 4 | 3 | 1 | 2 | 3 |
| 5 | 4 | 2 | 2 | 10 | 8 | 4 | 1 | 3 | 7 |
| 5 | 5 | 1 | 2 | 10 | 10 | 2 | 1 | 1 | 9 |
| 6 | 5 | 5 | 1 | 8 | 5 | 5 | 1 | 4 | 4 |
| 4 | 2 | 1 | 0 | — | — | — | — | — | — |
| 5 | 2 | 2 | 0 | — | — | — | — | — | — |
| 5 | 3 | 1 | 0 | — | — | — | — | — | — |

In the case of exact solutions, the assignments can be read from the table. Some ratios have no exact solution, such as 4:2:1, 5:2:2 and 5:3:1. In these cases the write rate for the fastest system (D0) is faster than the sum of the remaining systems (D1+D2). Therefore, the ratios can't be maintained because the slower systems won't have enough data to mix into all the parity stripes.

Figure 10:
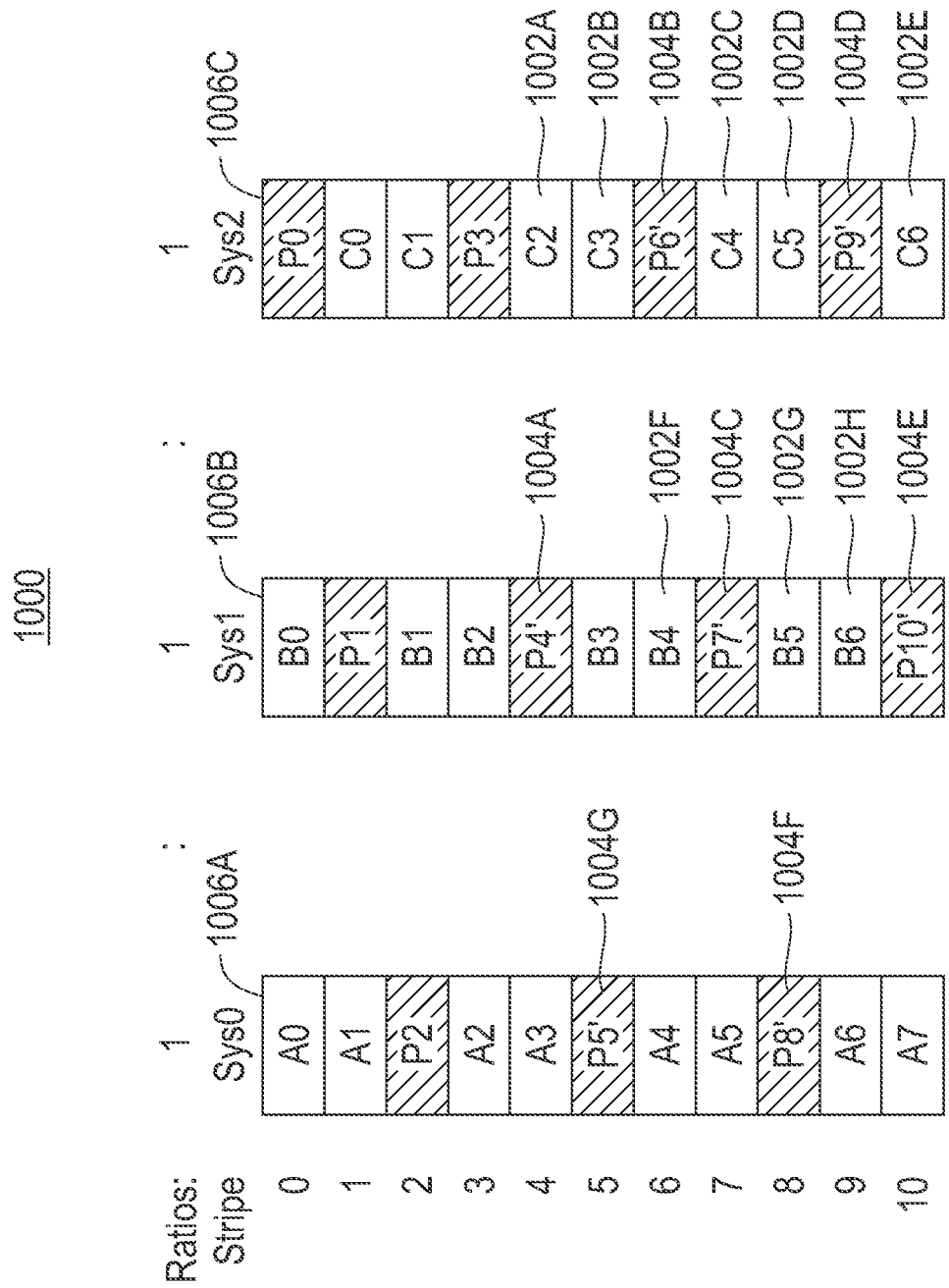
FIG. 10 illustrates a parity distribution in a situation when a 4:1:1 write ratio occurs on a 1:1:1 equal parity assignment layout, in accordance with one embodiment.

FIG. 10 shows a parity distribution 1000 in a situation when a 4:1:1 write ratio occurs on a 1:1:1 equal parity assignment layout. Unwritten stripes 1002A-H, and partial parity stripes 1004A-G (indicated by a Pn') are shown. In this case, once eight stripes are written to Sys0 1006A (A0-A7), Sys1 1006B has written up to B3, and Sys2 1006C has written up to C1. Thus there are seven partial parity stripes 1004A-G.

Instead, when there is no exact solution it is preferable to use approximate ratios which have solutions to minimize the need for partial parity writes.

Figure 11:
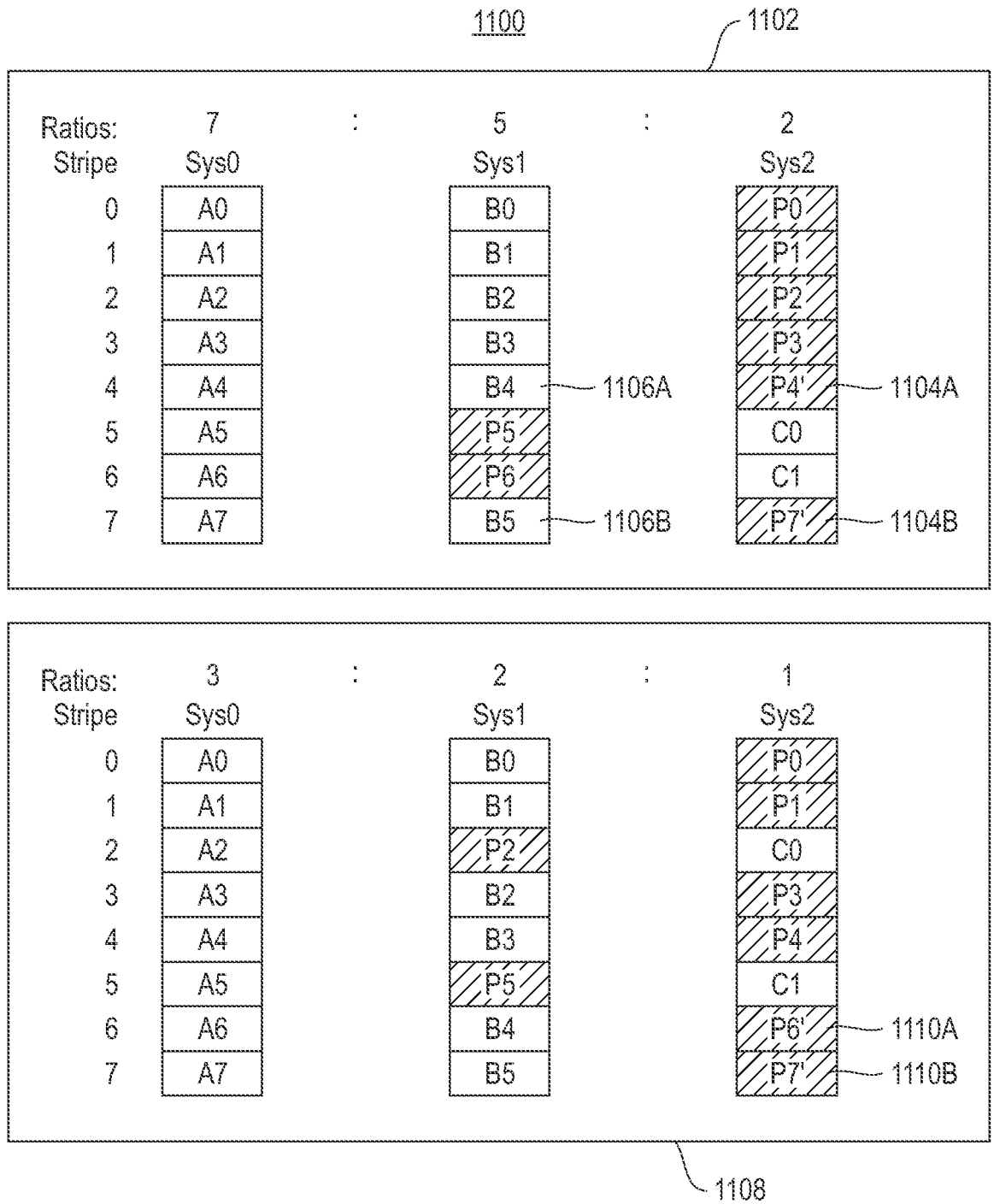
FIG. 11 illustrates parity distribution results of achieving a 4:2:1 write ratio with two different approximate write ratios, in accordance with one embodiment.

FIG. 11 shows parity distribution results 1100 of achieving a 4:2:1 write ratio with two different approximate write ratios. The top example 1102 shows results of a 7:5:2 base write ratio. Here, we have two partial parity writes, P4 1104A and P7 1104B, as only B4 1106A and B5 1106B are yet to written. The bottom example 1108 shows results of a 3:2:1 base write ratio. In this case, there are also two partial parity writes, P6 1110A and P7 1110B. Note that the storage allocation in each case is eight parity stripes instead of eleven using equal parity assignments (shown in FIG. 10). Further, the number of partial parity stripes has been reduced from seven to two.

In general, the write ratios may change with time. Thus, the system may adjust the parity assignments accordingly. While the parity assignments can be made as write data is accumulated in the system buffers, many factors can be considered to predictively manage the parity assignments. Predictive management allows parity assignments to be made in advance of receiving and processing write data, which may be advantageous. Such factors include measuring the write rate for each system (or write timing intervals), adaptively predicting the write rate, statically or via machine learning, etc.

Accordingly, the parity assignments also may be performed on-demand as data is received. An example of an on-demand parity assignment implementation is shown in FIG. 12. A sequence of data write operations 1200 is shown. At time T0, system 0 writes data A0, system 1 writes data B0 and system 2 write data C0. At time T1, system 0 writes data A1, and system 2 write data C1, and so forth. This sequence of writes shows a changing ratio of write rates between the systems. The parity can be assigned in an on-demand manner as shown in 1210.

In 1210 stripe 0 has parity P0 assigned to system 1. Data B0, is assigned to stripe 1, as it wasn't in stripe 0. It will likely wait in a buffer until further data is written to the cluster. After the T1 writes, stripe 1 has P1 assigned to system 2. Similarly, after the T2 writes, stripe 2 has P2 assigned to system 1. This process continues as the data comes in.

Each system can send a message to the other systems on the number of data units it has written, and require parity encoding. This again gives a set of values for which the write ratios can be computed, and the parity assignments thus can be determined. One of the systems may be selected as the arbiter for such decisions. For example, the system with the next proposed parity assignment may be selected.

Other factors include monitoring other levels of system activity associated with write activity, such as active processes/threads, number of users, number of applications, number of workloads, etc. For some operations, such as copy operations or rebuild operations, information is available on the amount of data being written, thus the duration of the workload can be determined. In addition, total workload, including read operations may be factored in. Information from service level agreements (SLAs) or quality of service (QOS) targets may be also used. For example, assigning additional parity to a system may be limited to an extent by the need to maintain a given read throughput. Once the write rates are established, then the new cluster parity assignments may be based on these write ratios.

When the system is log structured both locally and globally, these dynamic assignments may be made on the fly. For block based local or cluster codes, cluster parity can be dynamically assigned using a modified form of thin provisioning. With thin provisioning, space is only allocated to data at the time it is written. Cluster parity can be assigned via thin provisioning as well, providing a simple method of altering the ratio of parity and data in a given system. Here, thin provisioning allows cluster parity to be allocated on write, and the ratio of data to parity can be changed dynamically, as described above.

Initialization (selecting the initial local data and cluster parity volume capacities) should be based on the expected ratios. An even distribution is warranted if there is no information to the contrary. However, one might select starting ratios based on rough knowledge of the workloads on the various systems.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art.

Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
    determining a write speed for each of a plurality of systems in a cluster;
    determining a ratio of the write speeds for each of the plurality of systems in the cluster; and
    updating parity assignments to each of the plurality of systems in the cluster, based on the ratio of the write speeds.

2. The computer-implemented method of claim 1, wherein each of the plurality of systems includes a data storage system.

3. The computer-implemented method of claim 1, wherein data is written to the plurality of systems asynchronously.

4. The computer-implemented method of claim 1, wherein an erasure code for the cluster is log based.

5. The computer-implemented method of claim 1, wherein an erasure code for the cluster is block based.

6. The computer-implemented method of claim 1, wherein the write speed for each of the plurality of systems indicates an amount of data received by and written to the system over a predetermined period of time.

7. The computer-implemented method of claim 1, wherein each system includes a first volume for storing received data, and a second volume for storing cluster parity data.

8. The computer-implemented method of claim 1, wherein at least one volume of each system is thin provisioned.

9. The computer-implemented method of claim 1, wherein a parity of the cluster is thin provisioned.

10. The computer-implemented method of claim 1, wherein the write speed is predicted for one or more of the plurality of systems in the cluster.

11. The computer-implemented method of claim 1, wherein the updated parity assignments are based on a ratio of parity data to be written to each of the plurality of systems, that includes a ratio of parity data to be calculated by each of the plurality of systems and written to storage portions of the systems.

12. The computer-implemented method of claim 11, wherein the ratio of parity data to be written to each of the plurality of systems is based on the ratio of the write speeds.

13. The computer-implemented method of claim 1, wherein the write speed for each of the plurality of systems in the cluster is determined by monitoring the plurality of systems.

14. The computer-implemented method of claim 13, wherein the monitoring is performed according to a schedule.

15. The computer-implemented method of claim 13, wherein the monitoring is performed in response to identifying that a predetermined amount of data has been transferred to the cluster for storage.

16. The computer-implemented method of claim 13, wherein the monitoring is performed in response to identifying that a predetermined number of partial parity data computations have been performed by the plurality of systems in the cluster.

17. A computer program product for implementing a write-balanced parity assignment within a cluster, the computer program product comprising a computer readable storage medium having program instructions embodied therewith, wherein the computer readable storage medium is not a transitory signal per se, the program instructions executable by a processor to cause the processor to perform a method comprising:
    determining, by the processor, a write speed for each of a plurality of systems in the cluster;
    determining, by the processor, a ratio of the write speeds for each of the plurality of systems in the cluster; and
    updating, by the processor, parity assignments to each of the plurality of systems in the cluster, based on the ratio of the write speeds.

18. The computer program product of claim 17, wherein each of the plurality of systems includes a data storage system.

19. The computer program product of claim 17, wherein data is written to the plurality of systems asynchronously.

20. A system, comprising:
    a processor; and
    logic integrated with the processor, executable by the processor, or integrated with and executable by the processor, the logic being configured to:
        determine a write speed for each of a plurality of systems in a cluster;
        determine a ratio of the write speeds for each of the plurality of systems in the cluster; and
        update parity assignments to each of the plurality of systems in the cluster, based on the ratio of the write speeds.

* * * * *